United States Patent
Watanabe et al.

(10) Patent No.: US 12,088,318 B2
(45) Date of Patent: Sep. 10, 2024

(54) COMMUNICATION APPARATUS

(71) Applicants: AutoNetworks Technologies, Ltd., Yokkaichi (JP); Sumitomo Wiring Systems, Ltd., Yokkaichi (JP); Sumitomo Electric Industries, Ltd., Osaka (JP)

(72) Inventors: Masashi Watanabe, Yokkaichi (JP); Makoto Mashita, Yokkaichi (JP)

(73) Assignees: AutoNetworks Technologies, Ltd., Yokkaichi (JP); Sumitomo Wiring Systems, Ltd., Yokkaichi (JP); Sumitomo Electric Industries, Ltd., Osaka (JP)

( * ) Notice: Subject to any disclaimer, the term of this patent is extended or adjusted under 35 U.S.C. 154(b) by 180 days.

(21) Appl. No.: 17/905,369

(22) PCT Filed: Feb. 19, 2021

(86) PCT No.: PCT/JP2021/006278
§ 371 (c)(1),
(2) Date: Aug. 31, 2022

(87) PCT Pub. No.: WO2021/182071
PCT Pub. Date: Sep. 16, 2021

(65) Prior Publication Data
US 2023/0119130 A1    Apr. 20, 2023

(30) Foreign Application Priority Data
Mar. 9, 2020  (JP) .................... 2020-040059

(51) Int. Cl.
H03M 1/66    (2006.01)
H03H 7/06    (2006.01)
(Continued)

(52) U.S. Cl.
CPC ............. *H03M 1/66* (2013.01); *H03H 7/06* (2013.01); *H04B 3/548* (2013.01); *H04B 3/56* (2013.01);
(Continued)

(58) Field of Classification Search
CPC . H04B 3/548; H04B 3/56; H04B 3/30; H04B 1/40; H04B 15/005; H04B 15/04;
(Continued)

(56) References Cited

U.S. PATENT DOCUMENTS 5,970,138 A     10/1999  Suda et al.
10,382,216 B1 *  8/2019  Bhagwat ............. H04L 25/0272
(Continued)

FOREIGN PATENT DOCUMENTS

JP     2009-111911 A     5/2009

OTHER PUBLICATIONS

International Search Report, Application No. PCT/JP2021/006278, mailed May 25, 2021. ISA/Japan Patent Office.

*Primary Examiner* — Linh V Nguyen
(74) *Attorney, Agent, or Firm* — Honigman LLP

(57) ABSTRACT

In a communication apparatus, an analog circuit includes a circuit element to be connected to a first conductor, and processes a differential signal. A communication circuit receives, via a connection circuit, a differential signal processed by the analog circuit, and generates a signal for which the potential of a second conductor is used as a reference potential based on the received differential signal. An inductor is connected between the first conductor and the second conductor. The connection circuit includes a circuit element different from a capacitor. The analog circuit (21), the connection circuit, the communication circuit, the inductor, the first conductor, and the second conductor are housed in a conductive housing box.

8 Claims, 9 Drawing Sheets

(51) Int. Cl.
  *H04B 3/54*   (2006.01)
  *H04B 3/56*   (2006.01)
  *H04B 15/00*  (2006.01)
  *H05K 5/00*   (2006.01)
  *H05K 7/02*   (2006.01)
(52) U.S. Cl.
  CPC ......... *H04B 15/005* (2013.01); *H05K 5/0091* (2013.01); *H05K 7/02* (2013.01)
(58) Field of Classification Search
  CPC ...... H04B 2203/5445; H04B 2203/547; H04B 2203/5483; H04B 2203/5491; H04B 3/26; H04B 3/54; H04B 5/28; H01F 2017/0093; H01F 17/00; H01F 17/0013; H01F 17/04; H01F 17/045; H01F 2038/143; H01F 27/00; H01F 27/292; H01F 27/402; H01F 38/14; H03H 7/06; H03H 7/427; H03H 2001/005; H03H 7/09; H03M 1/66; H03M 9/00
  USPC ........................................................ 341/150
  See application file for complete search history.

(56) References Cited

U.S. PATENT DOCUMENTS

| | | | |
|---|---|---|---|
| 2015/0021994 A1* | 1/2015 | Bojarski | H02M 7/493 307/31 |
| 2015/0065039 A1* | 3/2015 | Nii | H01F 38/14 455/41.1 |
| 2017/0331520 A1 | 11/2017 | Okada et al. | |
| 2018/0026525 A1* | 1/2018 | Gardner | H04L 25/0272 333/181 |
| 2018/0145761 A1* | 5/2018 | Zhuge | H04B 10/077 |
| 2019/0342124 A1* | 11/2019 | Bhagwat | H04L 25/0298 |
| 2019/0386630 A1* | 12/2019 | Higuchi | H03H 7/09 |
| 2020/0313724 A1 | 10/2020 | Mashita et al. | |
| 2021/0036897 A1* | 2/2021 | Gardner | H04B 3/30 |
| 2021/0352376 A1* | 11/2021 | Huang | H04N 21/6118 |

* cited by examiner

FIG. 11
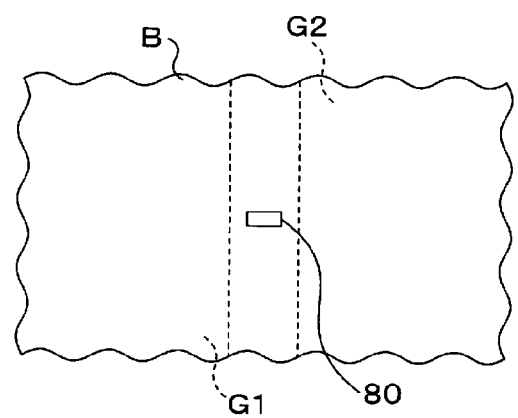
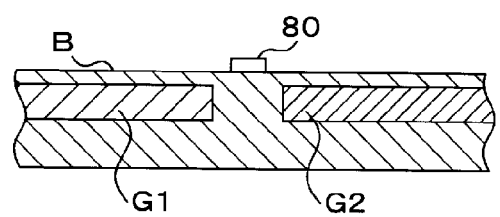

COMMUNICATION APPARATUS

CROSS-REFERENCE TO RELATED APPLICATIONS

This application is the U.S. national stage of PCT/JP2021/006278 filed on Feb. 19, 2021, which claims priority of Japanese Patent Application No. JP 2020-040059 filed on Mar. 9, 2020, the contents of which are incorporated herein.

TECHNICAL FIELD

The present disclosure relates to a communication apparatus.

BACKGROUND ART

JP 2009-111911A discloses a vehicle communication system in which a plurality of communication apparatuses communicate with each other. A communication apparatus described in JP 2009-111911A is an ECU (Electronic Control Unit), and receives a differential signal represented by the difference between two voltages. In the communication apparatus, a differential signal is input to an analog circuit. A reference potential (reference for zero V) of the analog circuit is a ground potential. The analog circuit performs analog processing on the input differential signal. The differential signal subjected to analog processing by the analog circuit is received by a communication circuit. The communication circuit converts the received differential signal into a single-ended signal for which the ground potential is used as a reference potential, and outputs the resultant single-ended signal.

In a conventional communication apparatus such as that described in JP 2009-111911A, high-frequency noise input to an analog circuit enters a communication circuit, and high-frequency noise input to the communication circuit enters the analog circuit. If high-frequency noise that enters one of the analog circuit and the communication circuit from the other circuit is high, there is the possibility that incorrect processing will be performed by the circuit into which the high-frequency noise entered. Furthermore, when designing the analog circuit and the communication circuit, not only high-frequency noise input to the circuit itself, but also high-frequency noise input from the other circuit needs to be taken into consideration. Therefore, difficulty in designing the analog circuit and the communication circuit is an issue.

In view of this, an object of the present disclosure is to provide a communication apparatus in which high-frequency noise that enters one of an analog circuit and a communication circuit from the other circuit is small.

SUMMARY

A communication apparatus according to one aspect of the present disclosure includes: a first conductor and a second conductor, an analog circuit that includes a circuit element to be connected to the first conductor, and processes a differential signal represented by a voltage difference between two conductive wires, a connection circuit that includes a circuit element different from a capacitor, and is to be connected to the analog circuit, a communication circuit that receives, via the connection circuit, the differential signal processed by the analog circuit, and generates a signal for which a potential of the second conductor is used as a reference potential, based on the received differential signal, a connection element that is a circuit element different from a capacitor, and is to be connected between the first conductor and the second conductor, and a conductive housing box that houses the first conductor, the second conductor, the analog circuit, the connection circuit, the communication circuit, and the connection element, and the housing box is electrically connected to a conductor whose surface area is larger of the first conductor and the second conductor.

Advantageous Effects of Present Disclosure

According to the present disclosure, high-frequency noise that enters one of an analog circuit and a communication circuit from the other circuit is small.

BRIEF DESCRIPTION OF DRAWINGS

FIG. 11 is a diagram for describing arrangement of a resistor.

DETAILED DESCRIPTION OF PREFERRED EMBODIMENTS

Figure 1:
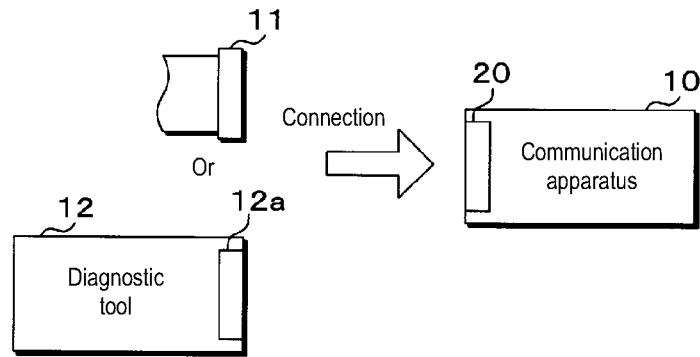
FIG. 1 is a diagram for describing an overview of a communication apparatus according to a first embodiment.

First, embodiments of the present disclosure will be listed and described. At least some of the embodiments to be described below may be suitably combined.

First Aspect

A communication apparatus according to a first aspect of the present disclosure includes: a first conductor and a second conductor, an analog circuit that includes a circuit element to be connected to the first conductor, and processes a differential signal represented by a voltage difference between two conductive wires, a connection circuit that includes a circuit element different from a capacitor, and is to be connected to the analog circuit, a communication circuit that receives, via the connection circuit, the differential signal processed by the analog circuit, and generates a signal for which a potential of the second conductor is used as a reference potential, based on the received differential signal, a connection element that is a circuit element different from a capacitor, and is to be connected between the first conductor and the second conductor, and a conductive housing box that houses the first conductor, the second conductor, the analog circuit, the connection circuit, the communication circuit, and the connection element, and the housing box is electrically connected to a conductor whose surface area is the larger of the first conductor and the second conductor.

In the first aspect, the analog circuit transmits a differential signal subjected to analog processing, to the communication circuit via the connection circuit that includes a circuit element different from a capacitor, such as an inductor or a resistor. A connection element such as an inductor or a resistor is connected between the first conductor and the second conductor. The connection circuit and the connection element suppress high-frequency noise propagating via the connection circuit and the connection element themselves. Therefore, if high-frequency noise enters the analog circuit, high-frequency noise that enters the communication circuit from the analog circuit is small. Similarly, if high-frequency noise enters the communication circuit, high-frequency noise that enters the analog circuit from the communication circuit is small.

In addition, since the first conductor, the second conductor, the analog circuit, the connection circuit, the communication circuit, and the connection element are housed in the housing box, high-frequency noise that enters the analog circuit and the communication circuit is small. Moreover, high-frequency noise that leaves the analog circuit and the communication circuit and moves to the outside of the housing box is also small. Moreover, the housing box is electrically connected to one conductor whose surface area is the larger of the first conductor and the second conductor. Therefore, floating capacity that is formed between the housing box and the other conductor and floating capacity that is formed between the first conductor and the second conductor are small. As a result, high-frequency noise that enters the communication circuit from the analog circuit via the floating capacity is small, and high-frequency noise that enters the analog circuit from the communication circuit via the floating capacity is also small.

Second Aspect

In the communication apparatus according to a second aspect of the present disclosure, the surface area of the second conductor is larger than the surface area of the first conductor.

In the second aspect, the surface area of the first conductor connected to the analog circuit is smaller, and the surface area of the second conductor connected to the communication circuit is larger.

Third Aspect

The communication apparatus according to a third aspect of the present disclosure includes: a resistor, an input circuit to which a voltage is input via the resistor, a first capacitor that is connected between one end of the resistor and the first conductor, and a second capacitor that is connected between the other end of the resistor and the second conductor.

In the third aspect, the resistor and the connection element suppress high-frequency noise propagating via the resistor and the connection element themselves. Therefore, if high-frequency noise enters the first conductor, high-frequency noise that propagates through the first capacitor and the resistor in the stated order is small, and high-frequency noise that enters the second conductor from the first conductor is also small. If high-frequency noise enters the second conductor, high-frequency noise that propagates through the second capacitor and the resistor in the stated order is small, and high-frequency noise that enters the first conductor from the second conductor is also small.

Fourth Aspect

The communication apparatus according to a fourth aspect of the present disclosure further includes: a connector that is to be detachably connected to an external apparatus, and a detection unit configured to detect connection of the external apparatus to the connector based on a voltage input to the input circuit, a voltage is input to the input circuit via the connector and the resistor, and, if the voltage input to the input circuit is higher than or equal to a threshold voltage, the detection unit detects connection of the external apparatus.

In the fourth aspect, if the voltage input to the input circuit via the connector and the resistor is higher than or equal to the threshold voltage, connection of an external apparatus to the connector is detected.

Fifth Aspect

In the communication apparatus according to a fifth aspect of the present disclosure, the distance between the resistor and the first conductor matches the distance between the resistor and the second conductor.

In the fifth aspect, the resistor is disposed such that the distance between the resistor and the first conductor matches the distance between the resistor and the second conductor. Therefore, the distance between the first conductor and the second conductor is long, and the floating capacity that is formed between the first conductor and the second conductor is small.

Sixth Aspect

In the communication apparatus according to a sixth aspect of the present disclosure, the analog circuit includes a termination circuit for preventing reflection of a differential signal, and the termination circuit is connected to the first conductor and midway portions of two conductive wires through which a differential signal propagates.

In the sixth aspect, the termination circuit is connected midway to two conductive wires through which a differential signal propagates, and the first conductor. The termination circuit prevents reflection of the differential signal.

Seventh Aspect

In the communication apparatus according to a seventh aspect of the present disclosure, the connection circuit includes a common-mode choke coil, and the communication circuit transmits a differential signal via the connection circuit.

In the seventh aspect, the connection circuit includes the common-mode choke coil. The common-mode choke coil includes two inductors. The two inductors are disposed at midway portions of two conductive wires that connect the analog circuit and the communication circuit. The differential signal propagates via the two conductive wires. The common-mode choke coil removes common-mode noise from a differential signal propagating from the analog circuit to the communication circuit, and removes common-mode noise from a differential signal propagating from the communication circuit to the analog circuit.

Eighth Aspect

The communication apparatus according to an eighth aspect of the present disclosure includes a remover that removes noise from a DC voltage for which a potential of the first conductor is used as a reference potential, the remover applies a voltage for which a potential of the second conductor is used as a reference potential and from which noise has been removed, to a power line for supplying power, the remover includes an inductor, and the inductor is the connection element.

In the eighth aspect, the remover removes noise from a voltage for which the potential of the first conductor is used as a reference potential, and applies, to the power line, a voltage for which the potential of the second conductor is used as a reference potential and from which noise has been removed. The remover is a common-mode choke coil, for example, and includes an inductor. This inductor is connected between the first conductor and the second conductor as a connection element.

Specific examples of a communication apparatus according to embodiments of the present disclosure will be described below with reference to the drawings. Note that the present disclosure is not limited to these illustrative examples, but is defined by the claims, and all changes which come within the meaning and range of equivalency of the claims are intended to be embraced therein.

Overview of Communication Apparatus

FIG. 1 is a diagram for describing an overview of a communication apparatus 10 according to the present embodiment. The communication apparatus 10 is an ECU (Electronic Control Unit), a gateway, or the like, and is mounted in a vehicle. The communication apparatus 10 includes a connector 20. The connector 20 is detachably connected to a cable 11 or a connector 12a of a diagnostic tool 12.

When the cable 11 is connected to the connector 20 of the communication apparatus 10, power is supplied to the communication apparatus 10 via the cable 11, and the communication apparatus 10 operates. The communication apparatus 10 transmits/receives a differential signal to/from another communication apparatus (not illustrated) via the cable 11. The communication apparatus 10 performs transmission/receiving based on a communication standard called "Broad-Reach", the CAN (Controller Area Network) communication standard, or the like.

If, for example, the communication apparatus 10 is an ECU that controls operations of a motor for locking and unlocking a door of a vehicle, when a differential signal instructing that the door be unlocked is received, the communication apparatus 10 causes the motor to unlock the door. If, for example, a sensor for detecting whether or not a door of the vehicle is locked is connected to the communication apparatus 10, the communication apparatus 10 transmits a differential signal indicating a detection result of the sensor to another communication apparatus, and notifies the other communication apparatus of the detection result.

When the connector 12a of the diagnostic tool 12 is connected to the connector 20 of the communication apparatus 10, the diagnostic tool 12 supplies power to the communication apparatus 10. Accordingly, the communication apparatus 10 operates. The communication apparatus 10 and the diagnostic tool 12 communicate with each other. The communication apparatus 10 transmits a differential signal that includes data to be used for detecting a failure, or so-called log data, to the diagnostic tool 12, for example. In addition, for example, the diagnostic tool 12 transmits a differential signal that includes update data for updating a computer program to be executed by the communication apparatus 10, to the communication apparatus 10.

Configuration of Communication Apparatus 10

Figure 2:
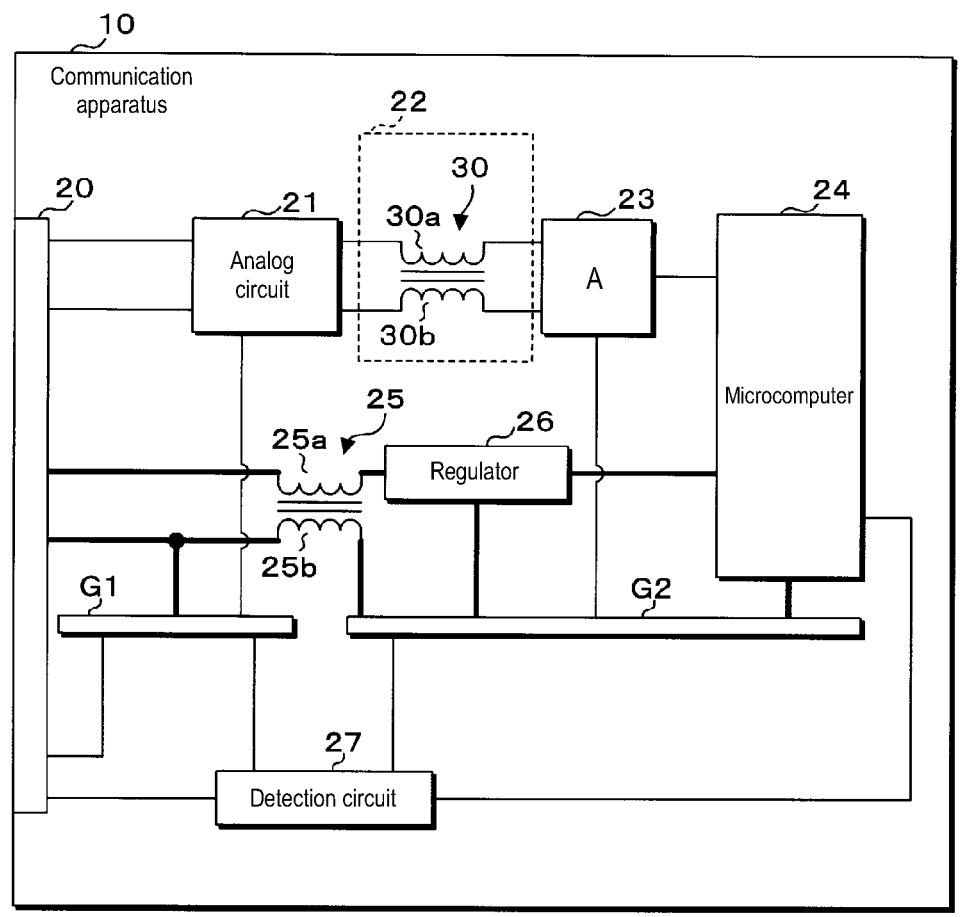
FIG. 2 is a block view showing main configurations of the communication apparatus.

FIG. 2 is a block view showing main configurations of the communication apparatus 10. In addition to the connector 20, the communication apparatus 10 includes an analog circuit 21, a connection circuit 22, a communication circuit 23, a microcomputer 24, a common-mode choke coil 25, a regulator 26, a detection circuit 27, a first conductor G1, and a second conductor G2. These are connected by conductive wires. Conductive wires that are used for power supply, in other words, power lines are indicated by thick solid lines. The first conductor G1 and the second conductor G2 are conductive, and are each made of a metal, for example.

The connection circuit 22 includes a common-mode choke coil 30. The common-mode choke coil 30 includes a first inductor 30a and a second inductor 30b. In the common-mode choke coil 30, the first inductor 30a and the second inductor 30b are each wound around an annular magnetic member (not illustrated). The common-mode choke coil 25 includes a first inductor 25a and a second inductor 25b. The common-mode choke coil 25 is configured in a similar manner to the common-mode choke coil 30.

The connector 20 is connected to the analog circuit 21 by two conductive wires. The analog circuit 21 is further connected to one ends of the first inductor 30a and the second inductor 30b of the common-mode choke coil 30 by two conductive wires. The analog circuit 21 is further connected to the first conductor G1 by a conductive wire. Connection to the first conductor G1 is made through what is known as "grounding". The other ends of the first inductor 30a and the second inductor 30b of the common-mode choke coil 30 are connected to the communication circuit 23 by two conductive wires. The communication circuit 23 is further connected to the microcomputer 24 and the second conductor G2 by two conductive wires. Connection to the second conductor G2 is also made through what is known as "grounding".

The connector 20 is further connected to one end of the first inductor 25a of the common-mode choke coil 25 by a conductive wire. The connector 20 is further connected to one end of the second inductor 25b of the common-mode choke coil 25 and the first conductor G1 by conductive wires. The other end of the first inductor 25a is connected to the regulator 26 by a conductive wire. The other end of the second inductor 25b is connected to the second conductor G2 by a conductive wire. The regulator 26 is further connected to the microcomputer 24 and the second conductor G2 by two conductive wires. The microcomputer 24 is further connected to the second conductor G2 by a conductive wire.

The connector 20 is further connected to the detection circuit 27 and the first conductor G1 by two conductive wires. The detection circuit 27 is further connected to the microcomputer 24, the first conductor G1, and the second conductor G2 by three conductive wires.

When the cable 11 is connected to the connector 20, the cable 11 is connected to the analog circuit 21, the common-mode choke coil 25, and the first conductor G1. The one end on the connector 20 side of the conductive wire that connects the connector 20 and the detection circuit 27 is open.

When the connector 12a of the diagnostic tool 12 is connected to the connector 20, the connector 12a of the diagnostic tool 12 is connected to the analog circuit 21, the common-mode choke coil 25, the detection circuit 27, and the first conductor G1.

A differential signal is input from the cable 11 or the diagnostic tool 12 to the analog circuit 21 via the connector 20. The differential signal is a binary signal, and indicates a voltage difference between two conductive wires. A differential signal of "0" indicates a voltage difference that is larger than or equal to a predetermined value, and a differential signal of "1" indicates a voltage difference that is smaller than the predetermined value, for example. The differential signal propagates via the two conductive wires.

The potential of the first conductor G1 is used as a reference potential (reference for zero V) of the analog circuit 21. The analog circuit 21 performs analog processing on the differential signal input from the connector 20. The communication circuit 23 receives the differential signal subjected to analog processing performed by the analog circuit 21, via the common-mode choke coil 30 of the connection circuit 22.

The common-mode choke coil 30 removes common-mode noise from the differential signal subjected to analog processing performed by the analog circuit 21, and outputs the differential signal from which common-mode noise has been removed, to the communication circuit 23. The common-mode noise is noise that is superimposed in the same phase on two conductive wires through which a differential signal propagates. The connection circuit 22 includes a circuit element different from a capacitor.

The communication circuit 23 generates a single-ended signal for which the potential of the second conductor G2 is used as a reference potential, based on the received differential signal, and outputs the generated single-ended signal to the microcomputer 24. The microcomputer 24 reads the voltage of the single-ended signal input from the communication circuit 23. Accordingly, the microcomputer 24 obtains data included in the single-ended signal. The microcomputer 24 executes various types of processing based on the data included in the single-ended signal input from the communication circuit 23.

The microcomputer 24 outputs the single-ended signal for which the potential of the second conductor G2 is used as a reference potential, to the communication circuit 23. The communication circuit 23 generates a differential signal based on the single-ended signal input from the microcomputer 24. The communication circuit 23 transmits the generated differential signal to a communication apparatus (not illustrated) or the diagnostic tool 12 via the connection circuit 22, the analog circuit 21, and the connector 20. The common-mode choke coil 30 of the connection circuit 22 removes common-mode noise from the differential signal transmitted by the communication circuit 23. The common-mode choke coil 30 outputs the differential signal from which common-mode noise has been removed, via the analog circuit 21 and the connector 20.

ADC voltage for which the potential of the first conductor G1 is used as a reference potential is input from the cable 11 or the diagnostic tool 12 to the common-mode choke coil 25 via the connector 20. The common-mode choke coil 25 removes common-mode noise from the voltage input to the first inductor 25a and the second inductor 25b. The voltage from which common-mode noise has been removed by the common-mode choke coil 25 is a voltage for which the potential of the second conductor G2 is used as a reference potential. The common-mode choke coil 25 applies the voltage from which common-mode noise has been removed, to the conductive wire connected to the regulator 26. Accordingly, the voltage from which common-mode noise has been removed is output to the regulator 26. The common-mode choke coil 25 functions as a remover. As shown in FIG. 2, the conductive wire connected between the connector 20 and the first inductor 25a, the conductive wire connected between the first inductor 25a and the regulator 26, and the conductive wire connected between the regulator 26 and the microcomputer 24 are power lines.

The regulator 26 converts the DC voltage input from the common-mode choke coil 25 into a setting voltage set in advance. The setting voltage is a DC voltage for which the potential of the second conductor G2 is used as a reference potential. The regulator 26 outputs the resultant setting voltage to the microcomputer 24. Accordingly, power is supplied to the microcomputer 24.

Note that the regulator 26 may further output the setting voltage to the communication circuit 23, and supply power to the communication circuit 23.

When the connector 12a of the diagnostic tool 12 is connected to the connector 20, the diagnostic tool 12 continues to output a DC voltage for which the potential of the first conductor G1 is used as a reference potential, to the detection circuit 27. The voltage output by the diagnostic tool 12 is higher than or equal to a threshold voltage set in advance. If the connector 12a of the diagnostic tool 12 is not connected to the connector 20, a voltage of zero V is output to the detection circuit 27. Here, the voltage of zero V is a voltage for which the potential of the first conductor G1 is used as a reference potential, and is lower than the threshold voltage.

The detection circuit 27 outputs a voltage that is based on the potential of the second conductor G2, to the microcomputer 24. The detection circuit 27 outputs a voltage of zero V or a predetermined voltage Vc (see FIG. 10). If the voltage input from the connector 20 is higher than or equal to the threshold voltage, in other words, if the diagnostic tool 12 is connected, the detection circuit 27 outputs a voltage of zero V to the microcomputer 24. If the voltage input from the connector 20 is lower than the threshold voltage, in other words, if the diagnostic tool 12 is not connected, the detection circuit 27 outputs the predetermined voltage Vc to the microcomputer 24. The microcomputer 24 detects whether or not the connector 12a of the diagnostic tool 12 is connected to the connector 20, based on the voltage input from the detection circuit 27.

Appearance of Communication Apparatus 10

Figure 3:
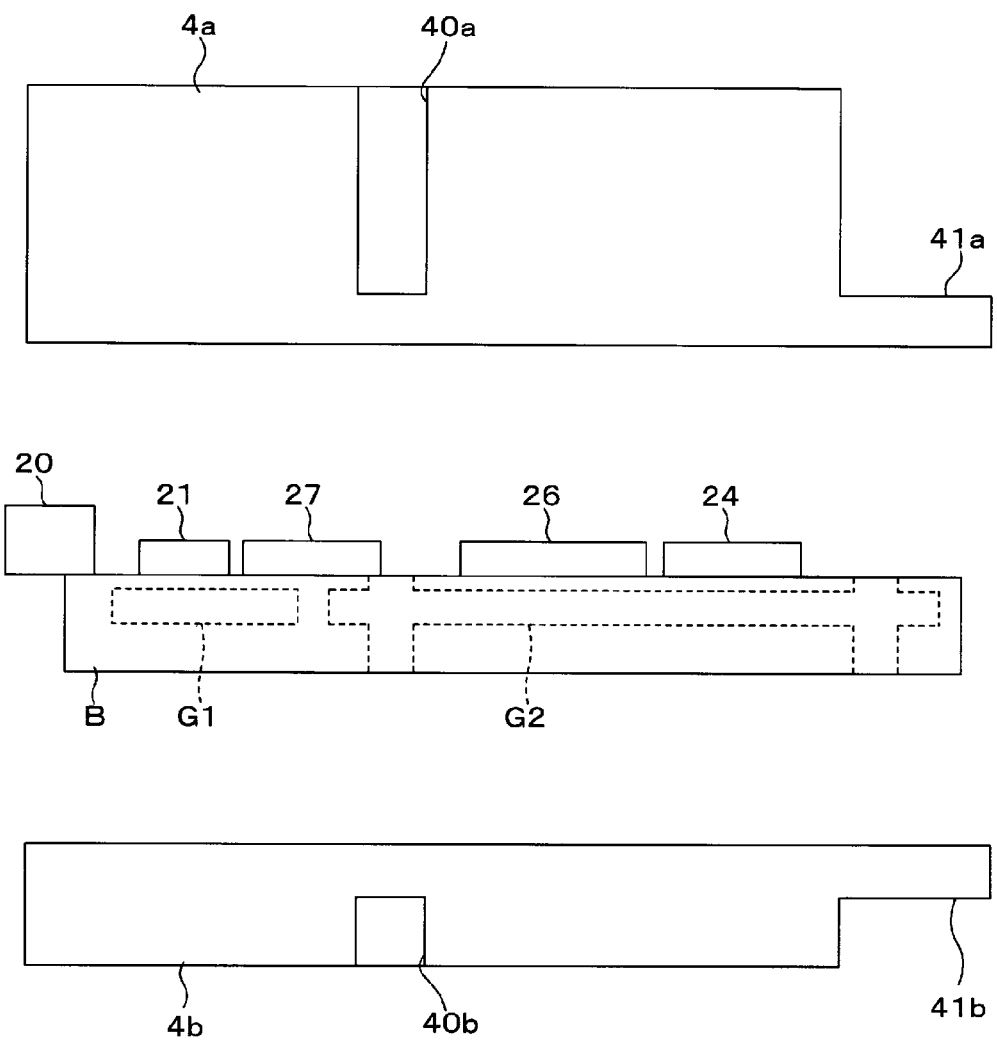
FIG. 3 is an exploded view of the communication apparatus.

FIG. 3 is an exploded view of the communication apparatus 10. The connector 20, the analog circuit 21, the connection circuit 22, the communication circuit 23, the microcomputer 24, the common-mode choke coil 25, the regulator 26, and the detection circuit 27 are disposed on the upper surface of a circuit substrate B. FIG. 3 shows the connector 20, the analog circuit 21, the microcomputer 24, the regulator 26, and the detection circuit 27. The first conductor G1 and the second conductor G2 are disposed in the circuit substrate B. The connector 20 is disposed at a front edge portion on the front side of the circuit substrate B. A portion of the connector 20 protrudes forward from the front edge.

The upper surface of the circuit substrate B is provided with a through hole and a conductive path (not illustrated). The conductive path is what is known as a circuit pattern. Connection to the first conductor G1 or the second conductor G2 is realized using the through hole and the conductive path. Specifically, a conductive foil is attached to the surface of the through hole. The conductive foil is electrically connected to the conductive path. A conductive wire is formed of both the conductive foil and the conductive path or a conductive path.

Figure 4:
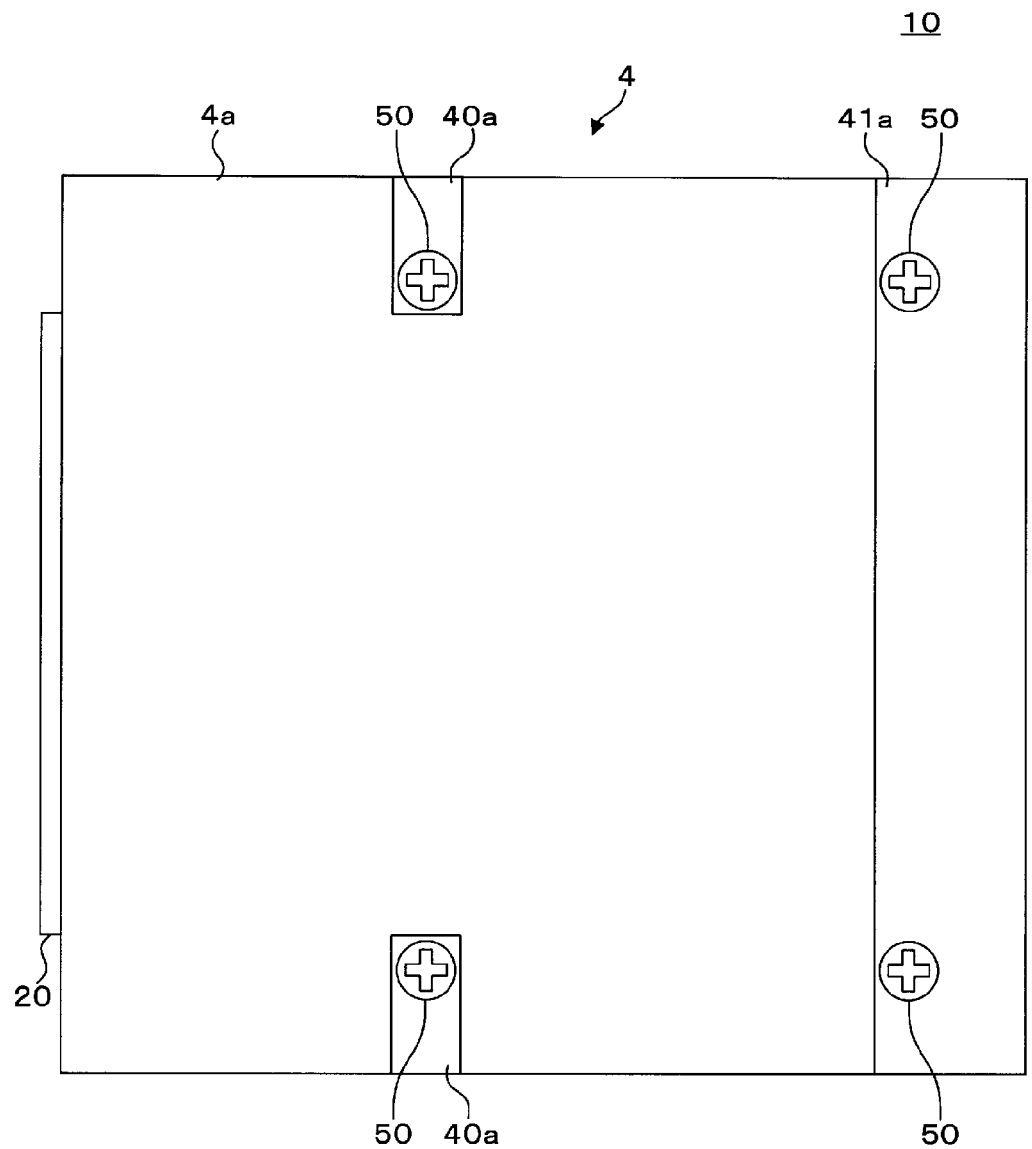
FIG. 4 is a plan view of the communication apparatus.
Figure 5:
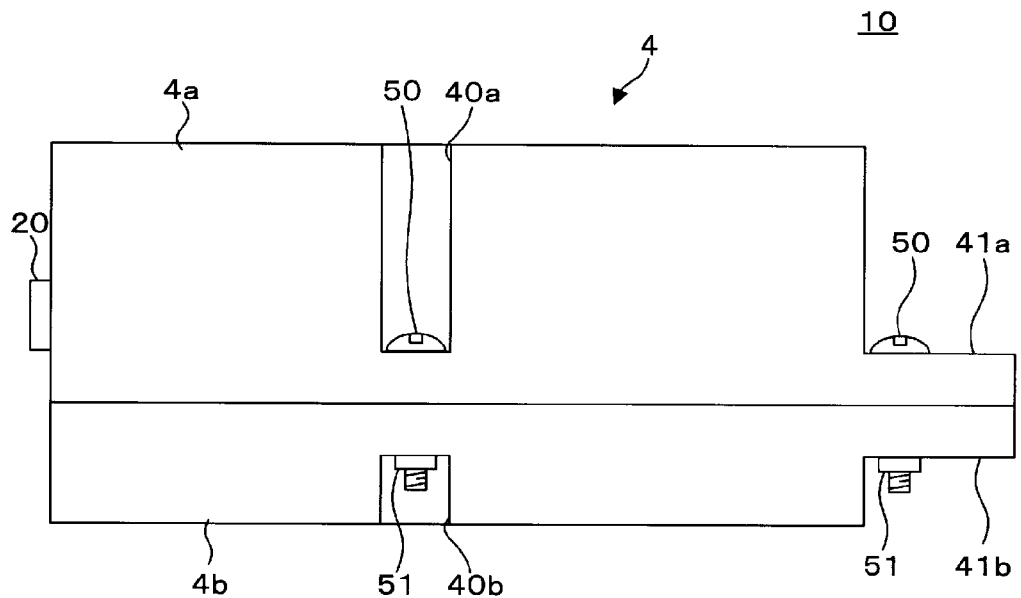
FIG. 5 is a side view of the communication apparatus.
Figure 6:
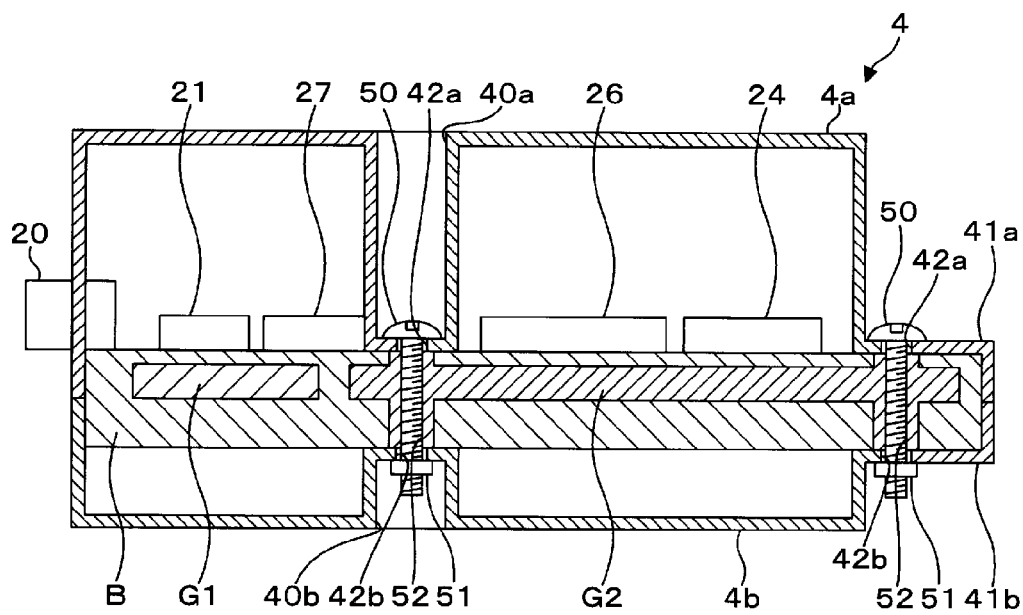
FIG. 6 is a cross-sectional view of the communication apparatus.

FIG. 4 is a plan view of the communication apparatus 10. FIG. 5 is a side view of the communication apparatus 10. FIG. 6 is a cross-sectional view of the communication apparatus 10. As shown in FIGS. 3 to 6, in the communication apparatus 10, the analog circuit 21, the connection circuit 22, the communication circuit 23, the microcomputer 24, the common-mode choke coil 25, the regulator 26, the detection circuit 27, and the circuit substrate B are housed in a conductive housing box 4. The housing box 4 is made of a metal, for example.

The housing box 4 is constituted by a conductive upper covering body 4a that covers the upper surface of the circuit substrate B, and a conductive lower covering body 4b that covers the lower surface of the circuit substrate B. The upper covering body 4a and the lower covering body 4b each have a box-like shape that is open on one side thereof. The upper covering body 4a is disposed such that the top wall thereof is located on the upper side. The lower covering body 4b is disposed such that the bottom wall thereof is located on the lower side. The edge portion around the opening of the upper covering body 4a is in contact with the edge portion around the opening of the lower covering body 4b. The upper surface of the circuit substrate B is located in the upper covering body 4a. The lower surface of the circuit substrate B is located in the lower covering body 4b.

Recess portions 40a and 41a that are recessed downward are formed in the top wall of the upper covering body 4a. The top wall of the upper covering body 4a has a rectangular shape, and is opposed to the upper surface of the circuit substrate B. Two recess portions 40a are respectively provided at portions on the left side and the right side of the top surface of the upper covering body 4a. The entire rear portion of the top wall of the upper covering body 4a is recessed, thereby forming the recess portion 41a.

Recess portions 40b and 41b that are recessed upward are formed in the bottom wall of the lower covering body 4b. The bottom wall of the lower covering body 4b has a rectangular shape, and is opposed to the lower surface of the circuit substrate B. Two recess portions 40b are respectively provided at portions on the left side and the right side of the bottom wall of the lower covering body 4b. The entire rear portion of the bottom wall of the lower covering body 4b is recessed, thereby forming the recess portion 41b. As shown in FIG. 6, the bottom surfaces of the recess portions 40a and 41a of the upper covering body 4a are opposed to the top surfaces of the recess portions 40b and 41b of the lower covering body 4b, respectively.

The upper covering body 4a has four through holes 42a that extend therethrough in the up-down direction. As shown in FIG. 4, two through holes 42a are respectively provided in the bottom walls of the two recess portions 40a. The remaining two through holes 42a are respectively provided on the left side and the right side of the recess portion 41a. Similarly, the lower covering body 4b also has four through holes 42b that extend therethrough in the up-down direction. Two through holes 42b are respectively provided in the top walls of the two recess portions 40b. The remaining two through holes 42b are respectively provided on the left side and the right side of the recess portion 41b. The four through holes 42a of the upper covering body 4a are opposed to the four through holes 42b of the lower covering body 4b.

Figure 7:
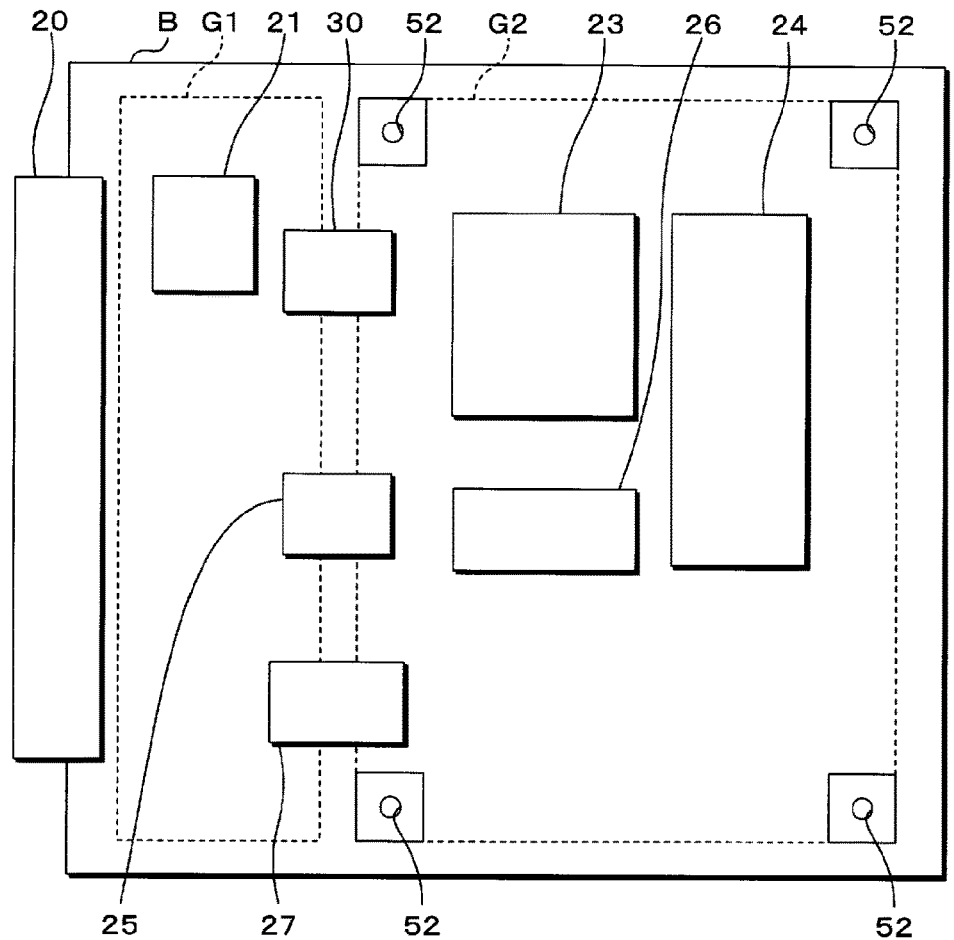
FIG. 7 is a plan view of a circuit substrate.

FIG. 7 is a plan view of the circuit substrate B. As shown in FIGS. 6 and 7, the second conductor G2 is exposed at four locations in the upper surface of the circuit substrate B. The second conductor G2 is also exposed at four locations in the lower surface of the circuit substrate B. The four surfaces of the second conductor G2 that are exposed from the lower surface of the circuit substrate B are disposed under the four surfaces of the second conductor G2 that are exposed from the upper surface of the circuit substrate B.

The four exposed surfaces of the second conductor G2 respectively have screw holes 52 that extend therethrough in the up-down direction. As shown in FIG. 6, in a state where screw thread portions of four screws 50 are respectively placed in the four through holes 42a of the upper covering body 4a from above, the four screws 50 are respectively inserted into the four screw holes 52. The four screws 50 are tightened. Accordingly, circumferential edge portions around the through holes 42a of the upper covering body 4a are sandwiched by the circuit substrate B and the head portions of the screws 50. At this time, circumferential edge portions around the through holes 42a of the upper covering body 4a come into contact with the second conductor G2, and the upper covering body 4a is electrically connected to the second conductor G2.

When the four screws 50 are tightened, the screw thread portions of the four screws 50 protrude on the lower side of the circuit substrate B. In a state where the screw thread portions of the four screws 50 that protrude on the lower side are respectively placed in the four through holes 42b of the lower covering body 4b from above, four nuts 51 are respectively mounted to the screw thread portions of the four screws 50 from the leading ends thereof. Accordingly, the circumferential edge portions around the through holes 42b of the lower covering body 4b are sandwiched between the circuit substrate B and the nuts 51. At this time, the circumferential edge portions around the through holes 42b of the lower covering body 4b are in contact with the second conductor G2, and the lower covering body 4b is electrically connected to the second conductor G2. The upper covering body 4a is electrically connected to the lower covering body 4b via the second conductor G2. The four screws 50 and the four nuts 51 are conductive, and are each made of a metal, for example.

As described above, the edge portion around the opening of the upper covering body 4a is in contact with the edge portion around the opening of the lower covering body 4b. The edge portion of the upper covering body 4a is directly electrically connected to the edge portion of the lower covering body 4b. The front wall of the upper covering body 4a has an opening (not illustrated) that extends therethrough in the front-and-rear direction. The connector 20 is inserted into the opening of the upper covering body 4a, and protrudes on the front side of the housing box 4.

Arrangement of Constituent Elements of Communication Apparatus 10

As shown in FIGS. 3 and 7, the circuit substrate B has a rectangular shape, and the first conductor G1 and the second conductor G2 have rectangular plate-like shapes. The plate-shaped surfaces of the first conductor G1 and the second conductor G2 are opposed to the plate-shaped surfaces of the circuit substrate B. The surface area of the second conductor G2 is larger than the surface area of the first conductor G1. The first conductor G1 and the second conductor G2 are aligned in the front-and-rear direction. The first conductor G1 and the second conductor G2 are covered with an insulative resin while being separated from each other.

As shown in FIG. 7, the analog circuit 21 that is connected to the first conductor G1 and is not connected to the second conductor G2 is disposed above the first conductor G1. The common-mode choke coil 25 and the detection circuit 27 that are connected to both the first conductor G1 and the second conductor G2 are disposed above the first conductor G1 and the second conductor G2. The common-mode choke coil 30 of the connection circuit 22 that is not connected either of the first conductor G1 and the second conductor G2 is also disposed above the first conductor G1 and the second conductor G2. The communication circuit 23, the microcomputer 24, and the regulator 26 that are not connected to the first conductor G1, and are connected to the second conductor G2 are disposed above the second conductor G2.

Figure 8:
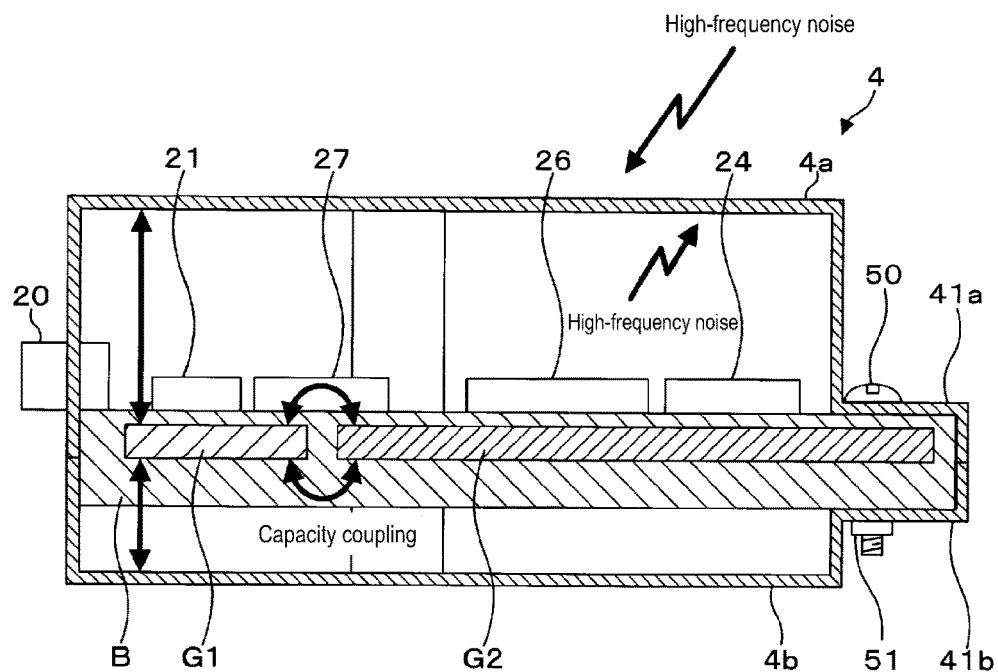
FIG. 8 is a diagram for describing effects of a housing box.

FIG. 8 is a diagram for describing effects of the housing box 4. As described above, the analog circuit 21, the connection circuit 22, the communication circuit 23, the microcomputer 24, the common-mode choke coil 25, the regulator 26, the detection circuit 27, and the circuit substrate B are housed in the conductive housing box 4. Therefore, high-frequency noise occurring outside the communication apparatus 10 is not likely to enter the communication apparatus 10, and high-frequency noise that does enter the analog circuit 21, the communication circuit 23, the microcomputer 24, the detection circuit 27, and the like is small. As an example, high-frequency noise occurs as static electricity is generated. As another example, high-frequency noise occurs as a result of interference by an electromagnetic field occurring when a signal is propagated through a conductive wire disposed near the communication apparatus 10.

In addition, it is difficult for high-frequency noise that has occurred in the analog circuit 21, the communication circuit 23, the microcomputer 24, the detection circuit 27, or the like to leave the communication apparatus 10. As a result, high-frequency noise that leaves the communication apparatus 10 from the analog circuit 21, the communication circuit 23, the microcomputer 24, the detection circuit 27, or the like to the outside is also small.

The first conductor G1 is not electrically connected to the housing box 4 and the second conductor G2. Therefore, capacity coupling occurs between the housing box 4 and the first conductor G1, and capacity coupling occurs between the first conductor G1 and the second conductor G2. When capacity coupling occurs, a floating capacity is formed.

In the communication apparatus 10, the housing box 4 is electrically connected to the second conductor G2 whose surface area is larger than the surface area of the first conductor G1. Therefore, the floating capacity formed between the housing box 4 and the first conductor G1 whose surface area is small is small, and the floating capacity formed between the first conductor G1 and the second conductor G2 is also small. Therefore, high-frequency noise that enters a circuit connected to the second conductor G2 from a circuit connected to the first conductor G1 via the floating capacity is small. High-frequency noise that enters a circuit connected to the first conductor G1 from a circuit connected to the second conductor G2 via the floating capacity is also small.

Configuration of Analog Circuit 21

Figure 9:
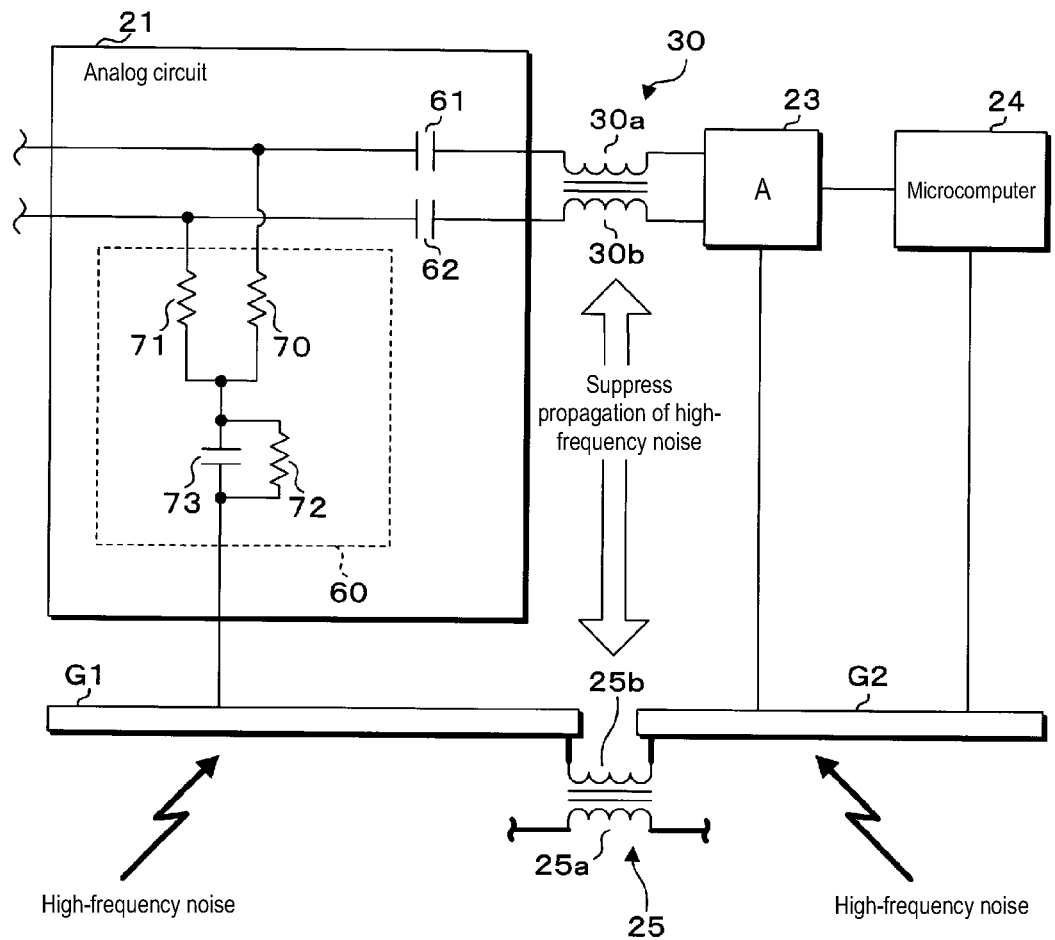
FIG. 9 is a diagram for describing an analog circuit.

FIG. 9 is a diagram for describing the analog circuit 21. The analog circuit 21 includes a termination circuit 60 and capacitors 61 and 62. The termination circuit 60 is connected to the first conductor G1 and midway portions of two conductive wires through which a differential signal propagates. One end of the capacitor 61 is connected to the connector 20 and the termination circuit 60. The other end of the capacitor 61 is connected to one end of the first inductor 30a of the common-mode choke coil 30. One end of the capacitor 62 is connected to the connector 20 and the termination circuit 60. The other end of the capacitor 62 is connected to one end of the second inductor 30b of the common-mode choke coil 30.

The termination circuit 60 executes analog processing for preventing reflection of a differential signal that propagates via the two conductive wires. The potential of the first conductor G1 is used as a reference potential of the termination circuit 60. The termination circuit 60 includes resistors 70, 71, and 72, and a capacitor 73. One ends of the resistors 70 and 71 are respectively connected to the one ends of the capacitors 61 and 62. The other ends of the resistors 70 and 71 are connected to one end of the capacitor 73. The other end of the capacitor 73 is connected to the first conductor G1. The resistor 72 is connected between the two ends of the capacitor 73.

The resistance value of the resistor 70 is a resistance value set in consideration of a property impedance of the propagation path of a signal that propagates through the conductive wire connected to the one end of the resistor 70. The other end of the resistor 70 is grounded via the capacitor 73. Therefore, reflection of a signal that propagates through the conductive wire connected to the one end of the resistor 70 is prevented. Similarly, the resistance value of the resistor 71 is a resistance value set in consideration of a property impedance of the propagation path of a signal that propagates through the conductive wire connected to the one end of the resistor 71. The other end of the resistor 71 is grounded via the capacitor 73. Therefore, reflection of a signal that propagates through the conductive wire connected to the one end of the resistor 71 is prevented. As a result, the resistors 70 and 71 prevent reflection of a differential signal that propagates through the two conductive wires.

As described above, analog processing that is performed by the analog circuit 21 is processing for preventing reflection of a differential signal, and is processing in which the potential of the first conductor G1 is used as a reference potential.

The capacitor 73 is disposed in order to remove noise that has propagated through the two conductive wires. Noise propagates from the two conductive wires to the first conductor G1 via the capacitor 73. The capacitor 73 discharges accumulated power via the resistor 72.

The capacitors 61 and 62 are used for AC (Alternating Current) coupling. The capacitors 61 and 62 remove DC components from a signal input from one ends thereof via the conductive wires, and output the signal from which DC components have been removed, from the other ends thereof. Therefore, the capacitors 61 and 62 remove DC components from a differential signal input via the connector 20, and remove DC components from a differential signal transmitted by the communication circuit 23.

Effects of Common-mode Choke Coils 25 and 30

As described above, there is the possibility that high-frequency noise that has occurred outside will enter the communication apparatus 10. If high-frequency noise enters the first conductor G1, the voltage of the first conductor G1 for which a predetermined potential such as a ground potential is used as a reference potential changes rapidly. A current flowing via the resistors 70 and 71 cannot keep up with the change in the voltage of the first conductor G1. Therefore, on the two conductive wires on the analog circuit 21 side of the common-mode choke coil 30, a voltage that is based on the potential of the first conductor G1 changes rapidly as the voltage of the first conductor G1 changes. Accordingly, high-frequency noise enters the analog circuit 21.

The second inductor 25b of the common-mode choke coil 25 is connected between the first conductor G1 and the second conductor G2. Therefore, even if the voltage of the first conductor G1 for which a predetermined potential is used as a reference potential changes, the voltage of the second conductor G2 for which a predetermined potential is used as a reference potential barely changes. The second inductor 25b functions as a connection element.

In addition, the first inductor 30a of the common-mode choke coil 30 is disposed at a midway portion of one conductive wire that connects the analog circuit 21 and the communication circuit 23. The second inductor 30b of the common-mode choke coil 30 is disposed at a midway portion of the other conductive wire that connects the analog circuit 21 and the communication circuit 23. Therefore, even if the voltages of the two conductive wires on the analog circuit 21 side of the common-mode choke coil 30 change, the voltages of the two conductive wires on the communication circuit 23 side of the common-mode choke coil 30 barely change.

As described above, the common-mode choke coils 25 and 30 respectively suppress high-frequency noise propagating via the common-mode choke coils 25 and 30 themselves. High-frequency noise that enters the communication circuit 23 from the analog circuit 21 is small.

If high-frequency noise enters the second conductor G2, the voltage of the second conductor G2 for which a predetermined potential such as a ground potential is used as a reference potential changes rapidly. A current flowing to the second conductor G2 via the communication circuit 23 cannot keep up with the change in the voltage of the second conductor G2. Therefore, on the two conductive wires on the communication circuit 23 side of the common-mode choke coil 30, a voltage for which the potential of the second conductor G2 is used as a reference potential changes rapidly, as the voltage of the second conductor G2 changes. Accordingly, high-frequency noise enters the communication circuit 23.

As described above, the first conductor G1 and the second conductor G2 are connected by the second inductor 25b of the common-mode choke coil 25. Therefore, even if the voltage of the second conductor G2 for which a predetermined potential is used as a reference potential changes, the voltage of the first conductor G1 for which a predetermined potential is used as a reference potential barely changes.

In addition, the first inductor 30a of the common-mode choke coil 30 is disposed at a midway portion of one conductive wire that connects the analog circuit 21 and the communication circuit 23. The second inductor 30b of the common-mode choke coil 30 is disposed at a midway portion of the other conductive wire that connects the analog circuit 21 and the communication circuit 23. Therefore, even if the voltages of the two conductive wires on the communication circuit 23 side of the common-mode choke coil 30 change, the voltages of the two conductive wires on the analog circuit 21 side of the common-mode choke coil 30 barely change.

As described above, the common-mode choke coils 25 and 30 respectively suppress high-frequency noise propagating via the common-mode choke coils 25 and 30 themselves. High-frequency noise that enters the analog circuit 21 from the communication circuit 23 is small.

Note that, as described above, the housing box 4 is electrically connected to the second conductor G2. Therefore, high-frequency noise entering the housing box 4 is equivalent to high-frequency noise entering the second conductor G2. However, the volume of the conductor constituted by the housing box 4 and the second conductor G2 is large. Therefore, the impedance of the conductor constituted by the housing box 4 and the second conductor G2 is small. As a result, a change in the voltage of the second conductor G2 if high-frequency noise enters the housing box 4, or if high-frequency noise enters the second conductor G2 is small.

Configuration of Detection Circuit 27

Figure 10:
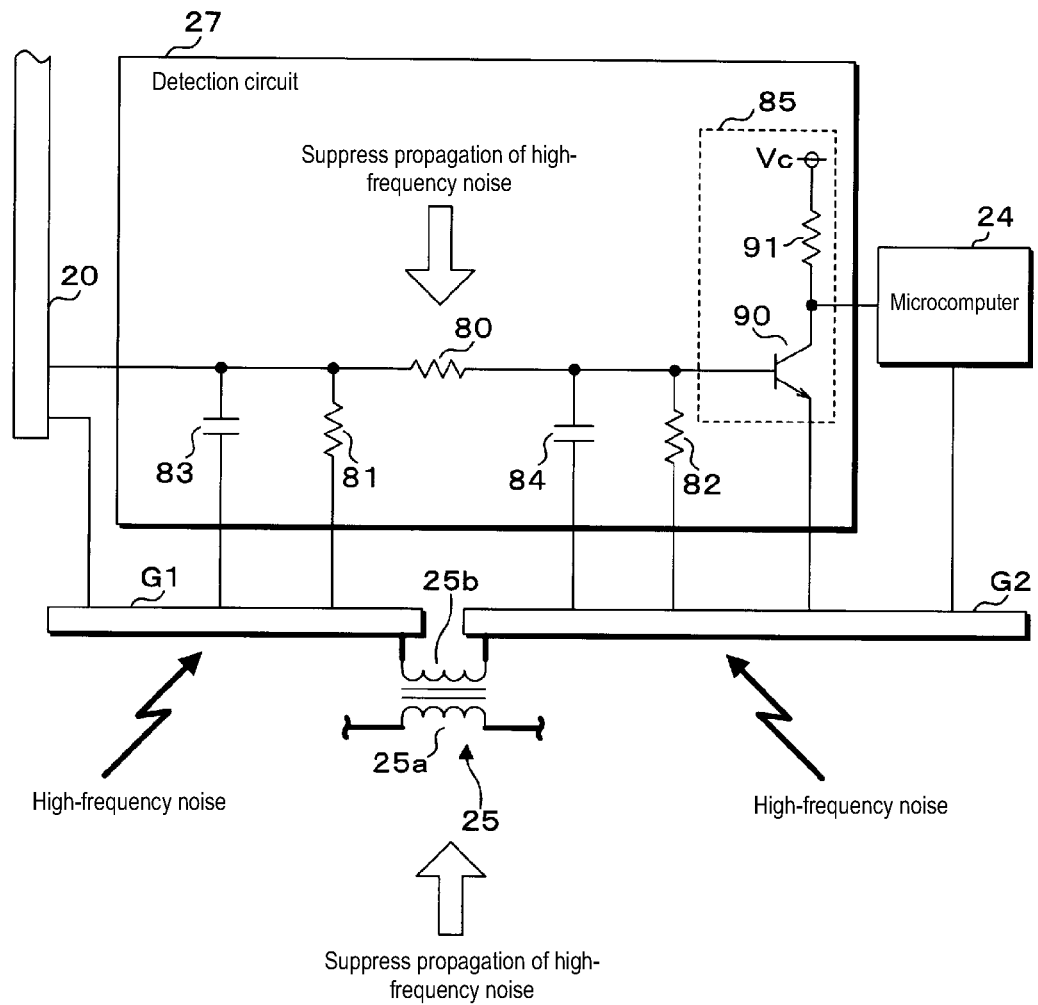
FIG. 10 is a diagram for describing a detection circuit.

FIG. 10 is a diagram for describing the detection circuit 27. The detection circuit 27 includes resistors 80, 81, and 82, capacitors 83 and 84, and an input circuit 85. The input circuit 85 includes an NPN bipolar transistor 90 and a resistor 91. One end of the resistor 80 is connected to the connector 20, one end of the resistor 81, and one end of the capacitor 83. The other ends of the resistor 81 and the capacitor 83 are connected to the first conductor G1. The other end of the resistor 80 is connected to the base of the bipolar transistor 90 of the input circuit 85, one end of the resistor 82, and one end of the capacitor 84. The other ends of the resistor 82 and the capacitor 84 are connected to the second conductor G2.

As described above, the capacitor 83 is connected between the one end of the resistor 80 and the first conductor G1. The capacitor 84 is connected between the other end of the resistor 80 and the second conductor G2. The capacitors 83 and 84 respectively function as a first capacitor and a second capacitor.

In the input circuit 85, the collector of the bipolar transistor 90 is connected to one end of the resistor 91. The predetermined voltage Vc is applied to the other end of the resistor 91. The predetermined voltage Vc is a constant voltage for which the potential of the second conductor G2 is used as a reference potential. The predetermined voltage Vc may be a setting voltage that is output by the regulator 26, for example. In this case, the regulator 26 applies the predetermined voltage Vc to the other end of the resistor 91. The collector of the bipolar transistor 90 is further connected to the microcomputer 24. The emitter of the bipolar transistor 90 is connected to the second conductor G2.

The bipolar transistor 90 functions as a switch. When a current flows through the base and the emitter of the bipolar transistor 90 in the stated order, the bipolar transistor 90 is switched on. When the bipolar transistor 90 is on, the resistance value between the collector and the emitter is sufficiently low, and a current flows through the resistor 91 and the bipolar transistor 90 in the stated order. When a current flowing via the base and the emitter of the bipolar transistor 90 stops, the bipolar transistor 90 is switched off. When the bipolar transistor 90 is off, the resistance value between the collector and the emitter is sufficiently high, and a current does not flow through the resistor 91 and the bipolar transistor 90 in the stated order.

If a voltage that is input from the connector 20 is higher than or equal to the above threshold voltage, a current flows through the base and the emitter of the bipolar transistor 90 in the stated order, and the bipolar transistor 90 is on. The voltage that is input from the connector 20 is a voltage for which the potential of the first conductor G1 is used as a reference potential. If the voltage input from the connector 20 is lower than the above threshold voltage, a current does not flow through the base and the emitter of the bipolar transistor 90 in the stated order, and the bipolar transistor 90 is off.

As described above, when the connector 12a of the diagnostic tool 12 is connected to the connector 20, the diagnostic tool 12 outputs, to the detection circuit 27, a voltage for which the potential of the first conductor G1 is used as a reference potential, and that is higher than or equal to the threshold voltage. At this time, a current flows from the positive terminal of the diagnostic tool 12 through the resistor 80, the base and the emitter of the bipolar transistor 90, the second conductor G2, the second inductor 25*b*, and the first conductor G1 in the stated order, and returns to the negative terminal of the diagnostic tool 12. Accordingly, the bipolar transistor is switched on, a current flows through the resistor 91 and the bipolar transistor 90 in the input circuit 85, and the second conductor G2 in the stated order. As a result, the input circuit 85 outputs a voltage of zero V to the microcomputer 24. The voltage of zero V is a voltage for which the potential of the second conductor G2 is used as a reference potential.

As described above, when connected to the connector 20, the diagnostic tool 12 outputs a DC voltage to the base of the bipolar transistor 90 of the input circuit 85 via the connector 20 and the resistor 80. At this time, the input circuit 85 outputs a voltage of zero V to the microcomputer 24.

As described above, when the connector 12*a* of the diagnostic tool 12 is not connected to the connector 20, a voltage of zero V is output to the detection circuit 27. Here, the voltage of zero V is a voltage for which the potential of the first conductor G1 is used as a reference potential, and is lower than the threshold voltage. When the voltage of zero V is output to the detection circuit 27, a current flowing via the base and the emitter of the bipolar transistor 90 stops, and the bipolar transistor 90 is switched off. At this time, a current does not flow through the resistor 91, and thus the predetermined voltage Vc is input to the microcomputer 24.

As described above, a voltage higher than or equal to the threshold voltage, or a voltage of zero V is input to the base of the bipolar transistor 90 of the input circuit 85 via the resistor 80. When a voltage higher than or equal to the threshold voltage is input to the input circuit 85, the input circuit 85 outputs a voltage of zero V to the microcomputer 24. When a voltage of zero V is input to the input circuit 85, the input circuit 85 outputs the predetermined voltage Vc to the microcomputer 24.

The microcomputer 24 detects whether or not the diagnostic tool 12 is connected to the connector 20 based on a voltage input from the input circuit 85, in other words, a voltage input to the input circuit 85 via the connector 20 and the resistor 80. Specifically, if the voltage input to the input circuit 85 is higher than or equal to the threshold voltage, the microcomputer 24 detects connection of the diagnostic tool 12. The diagnostic tool 12 and the microcomputer 24 respectively function as an external apparatus and a detection unit.

The resistor 80 regulates the magnitude of a current flowing through the base and the emitter of the bipolar transistor 90 in the stated order. Therefore, the resistance value of the resistor 80 is relatively high. The resistor 81 stabilizes the voltage input from the connector 20. The resistor 82 stabilizes the voltage between the emitter and the base of the bipolar transistor 90. The capacitor 83 smooths the voltage output from the connector 20 toward the resistor 80. The capacitor 84 smooths the voltage output from the connector 20 via the resistor 80.

Effects of Common-Mode Choke Coil 25 and Resistor 80

As described above, there is the possibility that high-frequency noise will enter the communication apparatus 10. If high-frequency noise is input to the first conductor G1, the voltage of the first conductor G1 for which a predetermined potential is used as a reference potential changes rapidly. A current flowing via the capacitor 83 cannot keep up with the change in the voltage of the first conductor G1. Therefore, at the one end on the connector 20 side of the resistor 80, a voltage for which the potential of the first conductor G1 is used as a reference potential changes rapidly as the voltage of the first conductor G1 changes.

As described above, the first conductor G1 and the second conductor G2 are connected by the second inductor 25*b* of the common-mode choke coil 25. Therefore, even when the voltage of the first conductor G1 for which a predetermined potential is used as a reference potential changes, the voltage of the second conductor G2 for which a predetermined potential is used as a reference potential barely changes.

In addition, the one end on the connector 20 side of the resistor 80 is connected to the first conductor G1 via the resistor 81. The one end on the input circuit 85 side of the resistor 80 is connected to the second conductor G2 via the resistor 82. Therefore, even if the voltage of the one end on the connector 20 side of the resistor 80 changes, the voltage of the one end on the input circuit 85 side of the resistor 80 barely changes.

If high-frequency noise is input to the second conductor G2, the voltage of the second conductor G2 for which a predetermined potential is used as a reference potential changes rapidly. A current flowing via the capacitor 84 cannot keep up with the change in the voltage of the second conductor G2. Therefore, at the one end on the connector 20 side of the resistor 80, a voltage for which the potential of the second conductor G2 is used as a reference potential changes rapidly as the voltage of the second conductor G2 changes.

As described above, the first conductor G1 and the second conductor G2 are connected by the second inductor 25*b* of the common-mode choke coil 25. Therefore, even if the voltage of the second conductor G2 for which a predetermined potential is used as a reference potential changes, the voltage of the first conductor G1 for which a predetermined potential is used as a reference potential barely changes.

As described above, the one end on the connector 20 side of the resistor 80 is connected to the first conductor G1 via the resistor 81. The one end on the input circuit 85 side of the resistor 80 is connected to the second conductor G2 via the resistor 82. Therefore, even if the voltage of the one end on the input circuit 85 side of the resistor 80 changes, the voltage of the one end on the connector 20 side of the resistor 80 barely changes.

As described above, the common-mode choke coil 25 and the resistor 80 suppress high-frequency noise propagating via the common-mode choke coil 25 and the resistor 80 themselves. Therefore, if high-frequency noise enters the first conductor G1, high-frequency noise that propagates through the capacitor 83 and the resistor 80 in the stated order is small, and high-frequency noise that enters the second conductor G2 from the first conductor G1 is also small. In addition, if high-frequency noise enters the second conductor G2, high-frequency noise that propagates through the capacitor 84 and the resistor 80 in the stated order is small, and high-frequency noise that enters the first conductor G1 from the second conductor G2 is also small.

Arrangement of Resistor 80 of Detection Circuit 27

FIG. 11 is a diagram for describing arrangement of the resistor 80. The upper part of FIG. 11 shows a portion of a surface of the circuit substrate B. The lower part of FIG. 11 shows a portion of a cross section of the circuit substrate B. The resistor 80 has a rectangular parallelepiped shape, and the resistor 80 is disposed at the center between the first conductor G1 and the second conductor G2 in planar view. End surfaces of the first conductor G1 and the second conductor G2 are opposed to each other along the longitudinal direction of the resistor 80. In planar view, the distance between the resistor 80 and the first conductor G1 matches the distance between the resistor 80 and the second conductor G2. Here, "matches" does not mean a complete match, and means a substantial match.

In addition, as shown in the lower part of FIG. 11, in the cross section, the distance between the resistor 80 and the first conductor G1 matches the distance between the resistor 80 and the second conductor G2. Here, also, "matches" does not mean a complete match, and means a substantial match.

As described above, the resistor 80 is positioned such that the distance between the resistor 80 and the first conductor G1 matches the distance between the resistor 80 and the second conductor G2. Therefore, the distance between the first conductor G1 and the second conductor G2 is long, and the floating capacity that is formed between the first conductor G1 and the second conductor G2 is made even smaller.

Second Embodiment

In the first embodiment, the second conductor G2 exposed on the upper side and the lower side of the circuit substrate B is in contact with the housing box 4. Portions of the second conductor G2 that are in contact with the housing box 4 are not limited to portions exposed on the upper side and lower side of the circuit substrate B.

The differences between the first embodiment and a second embodiment will be described below. Configurations other than configurations described below are in common with the first embodiment. Therefore, the same reference signs as the first embodiment are given to constituent elements that are in common with the first embodiment, and a description thereof is omitted.

Description of Second Conductor G2

Figure 12:
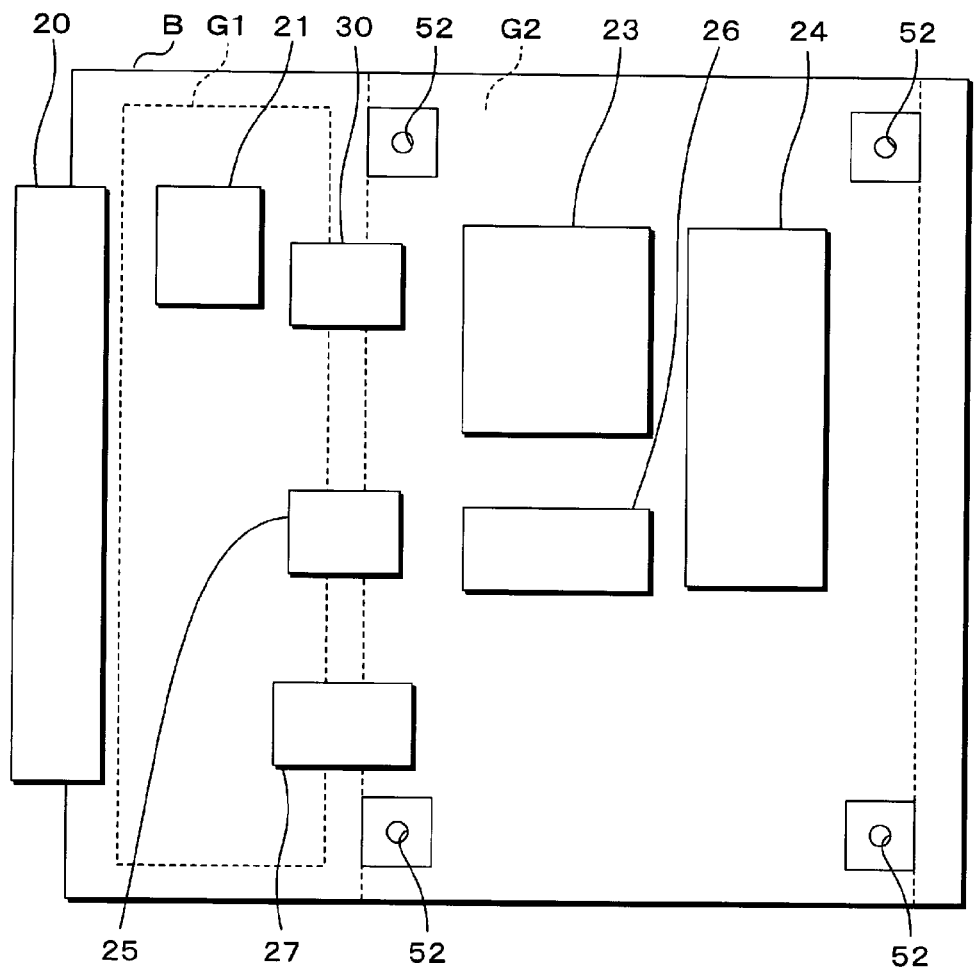
FIG. 12 is a plan view of a circuit substrate according to a second embodiment.
Figure 13:
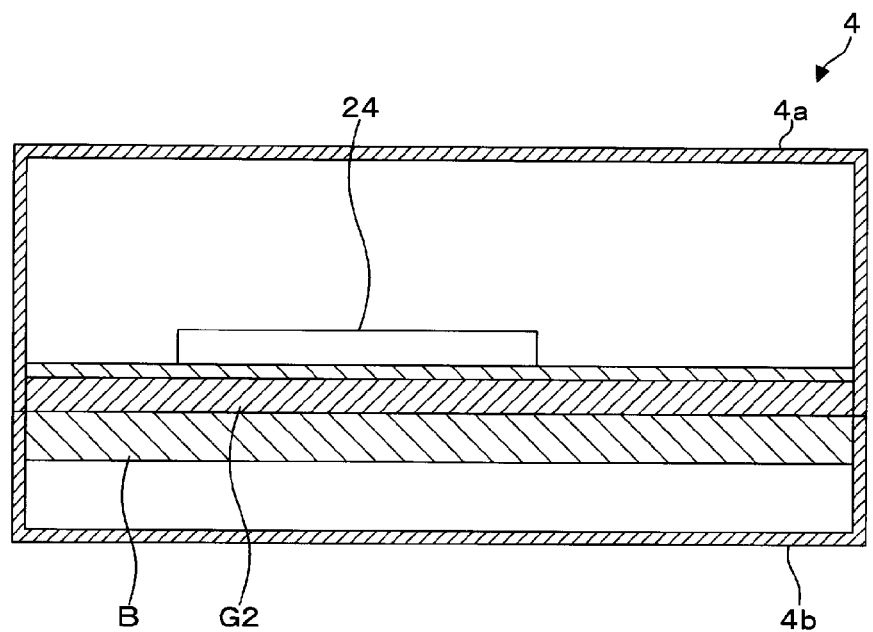
FIG. 13 is a cross-sectional view of a communication apparatus according to the second embodiment.

FIG. 12 is a plan view of the circuit substrate B according to the second embodiment. FIG. 13 is a cross-sectional view of the communication apparatus 10 according to the second embodiment. The cross section shown in FIG. 13 is a cross section taken in the left-right direction. As shown in FIGS. 12 and 13, the right end surface and the left end surface of the second conductor G2 in the circuit substrate B are exposed. The right end surface and the left end surface of the second conductor G2 are in contact with the upper covering body 4a constituting the housing box 4. This reinforces electrical connection between the second conductor G2 and the housing box 4.

The communication apparatus 10 according to the second embodiment has the same effects as the communication apparatus 10 according to the first embodiment.

Note that, in the second embodiment, the right end surface and the left end surface of the second conductor G2 are in contact with the housing box 4, and thus the surfaces of the second conductor G2 in the circuit substrate B do not need to be exposed on the upper side and lower side to be in contact with the housing box 4. In this case, the second conductor G2 does not need to be exposed on the upper side and the lower side of the circuit substrate B. In the first and second embodiments, it suffices for the housing box 4 to be in contact with the second conductor G2. Therefore, a method for bringing the housing box 4 into contact with the second conductor G2 is not limited to a method for bringing the housing box 4 into contact with surfaces of the second conductor G2 that are exposed on the upper side and the lower side, or a method for bringing the housing box 4 into contact with an end surface of the second conductor G2.

MODIFIED EXAMPLES

In the first and second embodiments, the configuration of the housing box 4 is not limited to a configuration in which an edge portion around an opening of the upper covering body 4a comes into contact with an edge portion around an opening of the lower covering body 4b. The upper covering body 4a of the housing box 4 may cover the upper side of the outer surfaces of the lower covering body 4b, for example. In this case, the inner surfaces of the upper covering body 4a come into contact with the outer surfaces of the lower covering body 4b. Furthermore, the housing box 4 is not limited to a box constituted by the upper covering body 4a and the lower covering body 4b.

In addition, in the first and second embodiments, if the surface area of the first conductor G1 is larger than the surface area of the second conductor G2, the first conductor G1, instead of the second conductor G2, may be electrically connected to the housing box 4.

In the first and second embodiments, the communication circuit 23 transmits/receives a differential signal not only when the cable 11 is connected to the connector 20, but also when the diagnostic tool 12 is connected to the connector 20. However, a communication circuit to/from which the diagnostic tool 12 performs transmission/receiving when the diagnostic tool 12 is connected to the connector 20 may be a communication circuit different from the communication circuit 23. In this case, the communication circuit further has a configuration that is similar to those of the analog circuit 21, the connection circuit 22, and the communication circuit 23. In this case, the communication standard of communication that is performed by the diagnostic tool 12 may be different from the communication standard of communication that is performed via the cable 11.

The circuit element of the connection circuit 22 is not limited to the common-mode choke coil 30, and may be any circuit element different from a capacitor. In the connection circuit 22, for example, two resistors may be respectively disposed at midway portions of the two respective conductive wires that connect the analog circuit 21 and the communication circuit 23. In addition, the connection element that is connected between the first conductor G1 and the second conductor G2 is not limited to the second inductor 25b, and may be any circuit element different from a capacitor. A resistor may be connected between the first conductor G1 and the second conductor G2, for example. In this case, the regulator 26 is connected to the connector 20 via an inductor. This inductor removes noise from a voltage.

A voltage that is output to the input circuit 85 via the resistor 80 by the diagnostic tool 12 is not limited to a DC voltage indicating connection, and may also be a voltage related to a communication signal. That is to say, the diagnostic tool 12 may transmit a communication signal to the microcomputer 24 via the input circuit 85.

Analog processing that is performed by the analog circuit 21 may be any analog processing that is based on the potential of the first conductor G1. Therefore, analog processing that is performed by the analog circuit 21 is not limited to processing for preventing reflection of a differential signal. Analog processing that is performed by the analog circuit 21 may also be processing for removing noise, for example. In this case, for example, in the analog circuit 21, one ends of two capacitors are connected at midway portions of two respective conductive wires through which a differential signal propagates, and the other ends of the two capacitors are connected to the first conductor G1.

The first and second embodiments that have been disclosed are to be considered as illustrative and non-limiting in all aspects. The scope of the present disclosure is indicated not by the above-stated meanings but by the claims, and all changes that come within the meaning and range of equivalency of the claims are intended to be embraced therein.

The invention claimed is:

1. A communication apparatus comprising:
a first conductor and a second conductor;
an analog circuit that includes a circuit element to be connected to the first conductor, and processes a differential signal represented by a voltage difference between two conductive wires;
a connection circuit that includes a circuit element different from a capacitor, and is to be connected to the analog circuit;
a communication circuit that receives, via the connection circuit, the differential signal processed by the analog circuit, and generates a signal for which a potential of the second conductor is used as a reference potential, based on the received differential signal;
a connection element that is a circuit element different from a capacitor, and is to be connected between the first conductor and the second conductor; and
a conductive housing box that houses the first conductor, the second conductor, the analog circuit, the connection circuit, the communication circuit, and the connection element,
wherein the housing box is electrically connected to a conductor whose surface area is the larger of the first conductor and the second conductor.

2. The communication apparatus according to claim 1, wherein the surface area of the second conductor is larger than the surface area of the first conductor.

3. The communication apparatus according to claim 1, further comprising:
a resistor;
an input circuit to which a voltage is input via the resistor;
a first capacitor that is connected between one end of the resistor and the first conductor; and
a second capacitor that is connected between the other end of the resistor and the second conductor.

4. The communication apparatus according to claim 3, further comprising:
a connector that is to be detachably connected to an external apparatus; and
a detection unit configured to detect connection of the external apparatus to the connector based on a voltage input to the input circuit,
wherein a voltage is input to the input circuit via the connector and the resistor, and
if the voltage input to the input circuit is higher than or equal to a threshold voltage, the detection unit detects connection of the external apparatus.

5. The communication apparatus according to claim 3, wherein the distance between the resistor and the first conductor matches the distance between the resistor and the second conductor.

6. The communication apparatus according to claim 1,
wherein the analog circuit includes a termination circuit for preventing reflection of a differential signal, and
the termination circuit is connected to the first conductor and midway portions of two conductive wires through which a differential signal propagates.

7. The communication apparatus according to claim 1,
wherein the connection circuit includes a common-mode choke coil, and
the communication circuit transmits a differential signal via the connection circuit.

8. The communication apparatus according to claim 1, further comprising:
a remover that removes noise from a DC voltage for which a potential of the first conductor is used as a reference potential,
wherein the remover applies a voltage for which a potential of the second conductor is used as a reference potential and from which noise has been removed, to a power line for supplying power,
the remover includes an inductor, and
the inductor is the connection element.

* * * * *